(12) United States Patent
Jin

(10) Patent No.: US 9,406,788 B2
(45) Date of Patent: Aug. 2, 2016

(54) STRUCTURE OF A TRENCH MOS RECTIFIER AND METHOD OF FORMING THE SAME

(71) Applicant: Chip Integration Tech.Co., Ltd., Zhubei, Hsinchu County (TW)

(72) Inventor: Qinhai Jin, Zhubei (TW)

(73) Assignee: Qinhai Jin, Zhubei, Hsinchu County (TW)

( * ) Notice: Subject to any disclaimer, the term of this patent is extended or adjusted under 35 U.S.C. 154(b) by 0 days.

(21) Appl. No.: 14/979,627

(22) Filed: Dec. 28, 2015

(65) Prior Publication Data

US 2016/0111530 A1    Apr. 21, 2016

Related U.S. Application Data

(62) Division of application No. 14/215,224, filed on Mar. 17, 2014, now Pat. No. 9,276,096.

(30) Foreign Application Priority Data

Jun. 21, 2013    (TW) .............................. 102122293 A

(51) Int. Cl.
| | |
|---|---|
| *H01L 29/417* | (2006.01) |
| *H01L 29/747* | (2006.01) |
| *H01L 29/06* | (2006.01) |
| *H01L 29/40* | (2006.01) |
| *H01L 29/423* | (2006.01) |
| *H01L 29/66* | (2006.01) |
| *H01L 29/74* | (2006.01) |

(52) U.S. Cl.
CPC .......... *H01L 29/747* (2013.01); *H01L 29/0607* (2013.01); *H01L 29/407* (2013.01); *H01L 29/42308* (2013.01); *H01L 29/66378* (2013.01); *H01L 29/742* (2013.01)

(58) Field of Classification Search
CPC ............ H01L 29/407; H01L 29/42308; H01L 29/66378; H01L 29/742
USPC .......................................... 257/119, 121, 124
See application file for complete search history.

(56) References Cited

U.S. PATENT DOCUMENTS

| | | | |
|---|---|---|---|
| 2009/0189218 A1* | 7/2009 | Pan ................... | H01L 29/66719 257/330 |
| 2010/0046263 A1 | 2/2010 | Deboy | |
| 2013/0249043 A1 | 9/2013 | Kuo et al. | |

* cited by examiner

*Primary Examiner* — Matthew E Warren
(74) *Attorney, Agent, or Firm* — McClure, Qualey & Rodack, LLP

(57) ABSTRACT

A structure of trench MOS rectifier and a method of forming the same are disclosed including a plurality of trenches formed in the n– drift epitaxial layer, a plurality of MOS structure formed on the substrate either in discrete islands or in rows. Asides the MOS gates there are source regions formed under the mesas. A top metal served as an anode is then formed on the resulted front surface connecting the MOS gates and the adjacent source regions.

3 Claims, 21 Drawing Sheets

US 9,406,788 B2

STRUCTURE OF A TRENCH MOS RECTIFIER AND METHOD OF FORMING THE SAME

RELATED APPLICATION

This application is a divisional application of prior application Ser. No. 14/215,224, which was filed on Mar. 17, 2014 of which is incorporated herein by reference.

FIELD OF THE INVENTION

The present invention pertains to a semiconductor device, in particularly, to a trench MOS (metal/oxide/semiconductor) device and a method of making the same.

DESCRIPTION OF THE PRIOR ART

The Schottky diode is an important power device and is widely applied for power supply switch, motor control, telecom switch, industrial automation, electrical automation, etc., and several high speed power-switches. What spotlights on the Schottky diode may be due to good performance thereof. For instance, the forward bias voltage drop is low; the reverse recovery time ($t_{RR}$) is very short; and the breakdown voltage may withstand as high as about 250 voltages at a reverse bias. However, due to the image charge potential barrier lower, the leakage current of Schottky diode is higher than that of PN type diodes and increasing with the reverse bias voltage increases. Another drawback of the Schottky diode is that the reliability of the metal-semiconductor junction is decreasing when an operating temperature is soaring to a critical level thereby lowering the bearing surge voltage capability during forward and reverse biased.

There are several of conventional trench rectifier devices are developed. Of the one, please refer to another Taiwan patent Application with a series no. 101,140,637 by the present inventor.

Recently, to solve the foregoing problem, a novel MOS rectifier diode is developed. As shown in the FIG. 1, a top metal layer formed on the MOS gate, a metal layer or poly-Si layer 15/gate oxide layer 10 is connected to the source electrode 5. A heavily doped source electrode 5 is formed in the p-well. While the region beneath the MOS gate, the current does not flow from the left toward the right but downward to the n+ substrate 5 via a vertical channel 30 due to equal potential between the drain electrode and the source electrode. At a reverse bias, the vertical channel is cutoff by a depletion region generated by the p-wells. The MOS ensure the performance of trench rectifier device is similar to a Schottky diode while it is forward biased whereas the performance of it has much improvement while it is under reverse biased. It is because image charge potential barrier lowering does not occur so that the leakage current is a constant rather than increase with increasing the reverse biased voltage.

The present invention discloses a novel trench MOS rectifier device to use any planar area of the substrate that can be utilized so as to reach the purpose of lower forward biased voltage $V_F$ and least leakage current.

SUMMARY OF THE INVENTION

An object of the present invention is to disclose a novel trench MOS rectifier device having a plurality of planar MOS gates to lower a switched on forward voltage and least leakage while under reversal biased.

In accordance with a first preferred embodiment of the present invention, a trench rectifier device is formed in an n type lightly doped epitaxial layer (n− epi-layer) supported by a heavily doped n type semiconductor substrate having a top metal layer as an anode electrode over planar MOS gates formed on the mesas and on the implanted regions aside the MOS gates.

The trench rectifier device comprises a plurality of trenches in parallel and spaced each other with a mesa formed in the n− epi-layer. A trench oxide layer conformally is formed on bottoms and sidewalls of the trenches. A first poly-Si layer having conductive impurities in-situ doped is formed to fill the trenches and to form a trench MOS structure. A plurality of planar MOS gates having a second poly-Si layer/a thinner gate oxide layer are then formed on the mesas. The second poly-Si layer has conductive impurities in-situ doped. The asides the MOS structure are p-type impurity doped regions formed into the mesas. After exposed planar gate oxide removal, a top-metal layer served as anode of the rectifier device is then formed on the MOS structures and on the p-implanted regions. A bottom metal layer formed on the backside of the heavily doped n type semiconductor substrate served as cathode.

The modified structure of the first preferred embodiment further comprises n+ regions formed in the p implanted regions to further lower the forward voltage.

In accordance with a second preferred embodiment of the present invention, a trench rectifier device is formed in an n− epi-layer supported by a heavily doped n type semiconductor substrate having a top metal layer served as n anode over a plurality of rows of planar MOS gates formed on the mesas and first poly-Si layer and on the implanted regions aside the MOS gates.

The trench rectifier device comprises a plurality of trenches in parallel and spaced each other with a mesa formed in the n− epi-layer. A thermal trench oxide layer is formed on bottoms and sidewalls of the trenches. A first poly-Si layer having conductive impurities in-situ doped is formed to fill the trenches and to form a trench MOS structure. A plurality of rows of planar MOS gates having a second poly-Si layer/a thinner gate oxide layer are then formed on the mesas and a first poly-Si layer. The two sides of the MOS structure are p-type impurity doped regions formed into the mesas. After exposed planar gate oxide removal, a top-metal layer served as anode electrode of the device is then formed on the MOS structures and on the p-implanted regions. A bottom metal layer formed on the backside of the heavily doped n type semiconductor substrate served as cathode.

The modified structure of the second preferred embodiment further comprises n+ regions formed in the p implanted regions to further lower the forward voltage.

In accordance with a third preferred embodiment of the present invention, a trench rectifier device is formed in an n type lightly doped epitaxial layer supported by a heavily doped n type semiconductor substrate having a top metal layer served as an anode over a plurality of rows of first poly-Si layer included a plurality of planar MOS gates on the mesas and on the implanted regions.

The trench rectifier device comprises a plurality of trenches in parallel and spaced each other with a mesa formed in the n− epi-layer. A thermal trench oxide layer is formed on bottoms and sidewalls of the trenches. A planar gate oxide layer is formed on the mesas. A first poly-Si layer having conductive impurities in-situ doped is then formed to over-fill the trenches and the planar gate oxide. The first poly-Si layer is then pattern as a plurality rows including planar MOS gates having a first poly-Si layer/a thinner gate oxide layer formed on the mesas. The two sides of the MOS structure are p-type impurity doped regions formed into the mesas. After exposed planar gate oxide removal, a top-metal layer served as anode electrode of the device is then formed on the MOS structures and on the p-implanted regions. A bottom metal layer formed on the backside of the heavily doped n type semiconductor substrate served as cathode.

The modified structure of the second preferred embodiment further comprises n+ regions formed in the p implanted regions to further lower the forward voltage.

DESCRIPTION OF THE PREFERRED EMBODIMENT

The present invention discloses a trench MOS device structure, as described in the following figures hereinafter, the uppercase A, B, C in FIG. # A, FIG. # B, FIG. #0 represent, respectively, along the cutting lines AA,'BB' and CC' of the top views FIG. 2a-FIG. 2e. The label "+" and "−" following n or p represent, respectively, heavily doped (implanted) and lightly doped (implanted). To facilitate illustrating the detailed structure, a top metal layer 180 is skipped in the top plan views. As to the detailed connection relationship between elements in the semiconductor device, please refer to the cross-sectional views in the following figures.

Figure 1:
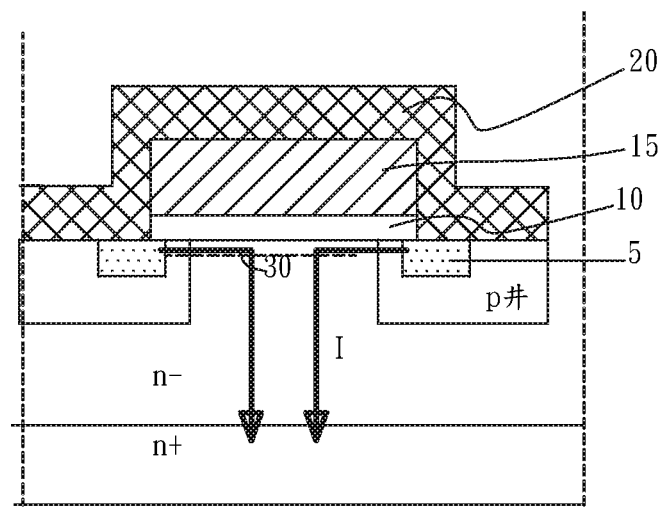
FIG. 1 is a cross-sectional view illustrating a rectifier having anode electrode connected a planar MOS gate with implanted regions in accordance with a prior art.
Figure 2A:
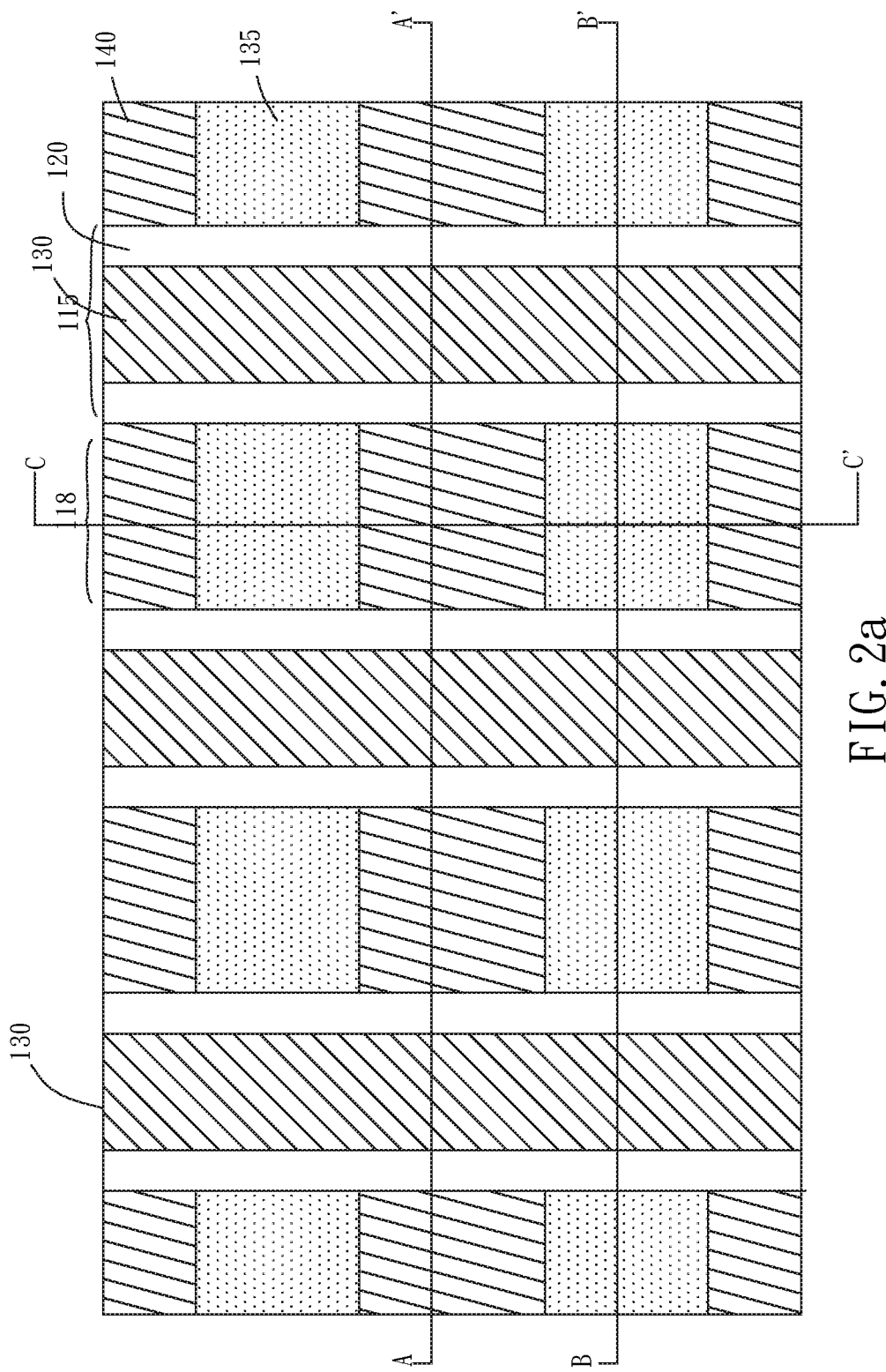
FIG. 2a is a top view illustrating a trench MOS rectifier (the top metal layer is not shown) in accordance with a first preferred embodiment of the present invention.
Figure 8A:
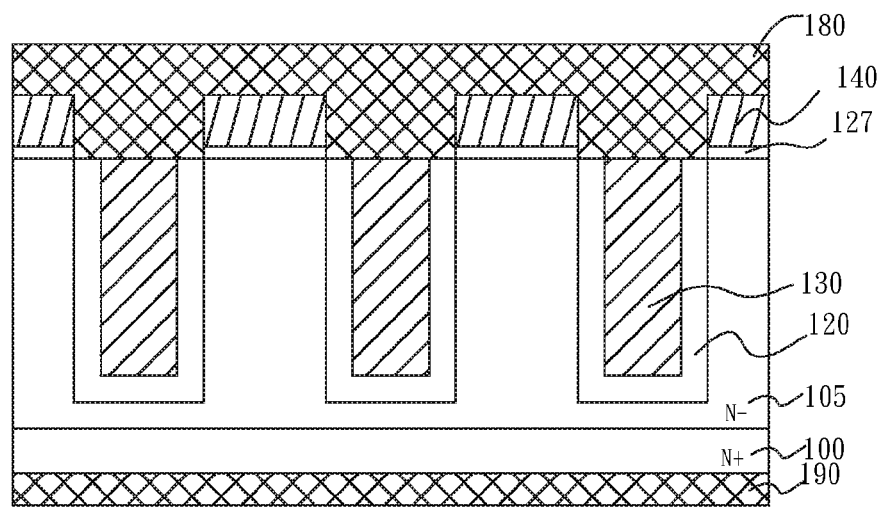
FIG. 8A, FIG. 8B and FIG. 8C are the cross-sectional views respectively, along the A-A' line, the B-B' line and the C-C' line shown in FIG. 2a illustrating the final structure of a trench MOS rectifier in accordance with the first preferred embodiment of the present invention
Figure 8B:
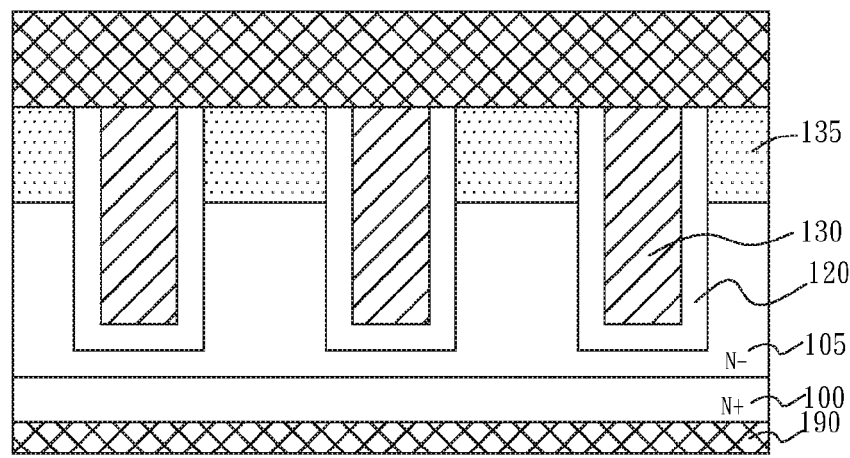
Figure 8C:
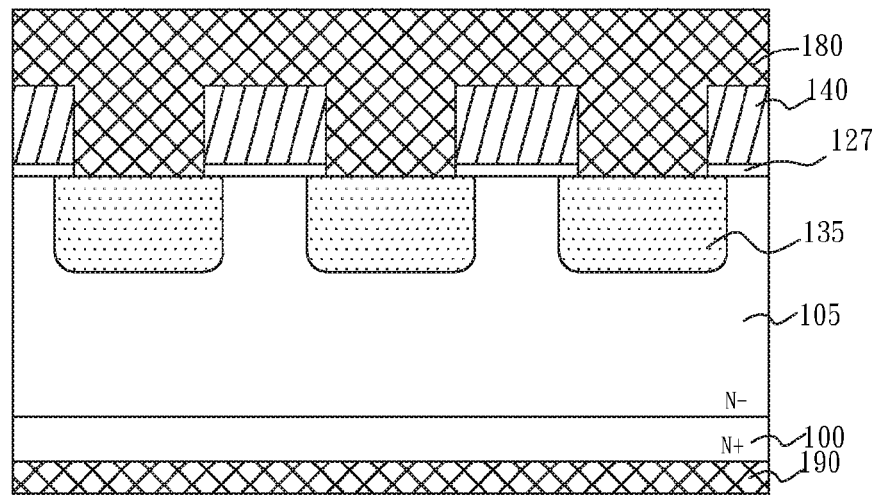

In accordance with a first preferred embodiment of the present invention, a trench rectifier device is illustrated in the plan-view FIG. 2a and cross-sectional views, FIG. 8A, FIG. 8B and FIG. 8C. The figures show an n– epi-layer 105 on a n+ semiconductor substrate 100 having a plurality of trenches 115 in parallel and spaced each other with a mesa 118 formed therein. A trench oxide layer 120 is conformally formed on bottoms and sidewalls of the trenches. A first poly-Si layer 130 having conductive impurities in-situ doped is formed on the trench oxide layer 120 and filled the trenches 115 to form a trench MOS structure. A plurality of MOS structures formed on the mesas 118. Each MOS structure has a second poly-Si layer 140 formed on the planar gate oxide layer 127, which is formed on the mesa 118. The second poly-Si layer 140 has conductive impurities in-situ doped. Asides of the MOS structure are p-type impurity doped region 135 formed into the mesas as sources regions. A top-metal layer 180 served as anode electrode of the device is then formed on the MOS structures and on the sources regions 135 to connect them. A bottom metal layer 190 as a cathode is formed on the backside of the n+ semiconductor substrate 100.

Alternatively, each p-type impurity implanted region 135 further comprises two separate n+ impurity implanted regions 145. The n+ impurity implanted regions 145 adjacent the MOS structure. Please refer to plan-view FIG. 2B and cross-sectional views FIG. 10A, FIG. 10B and FIG. 10C.

Figure 2B:
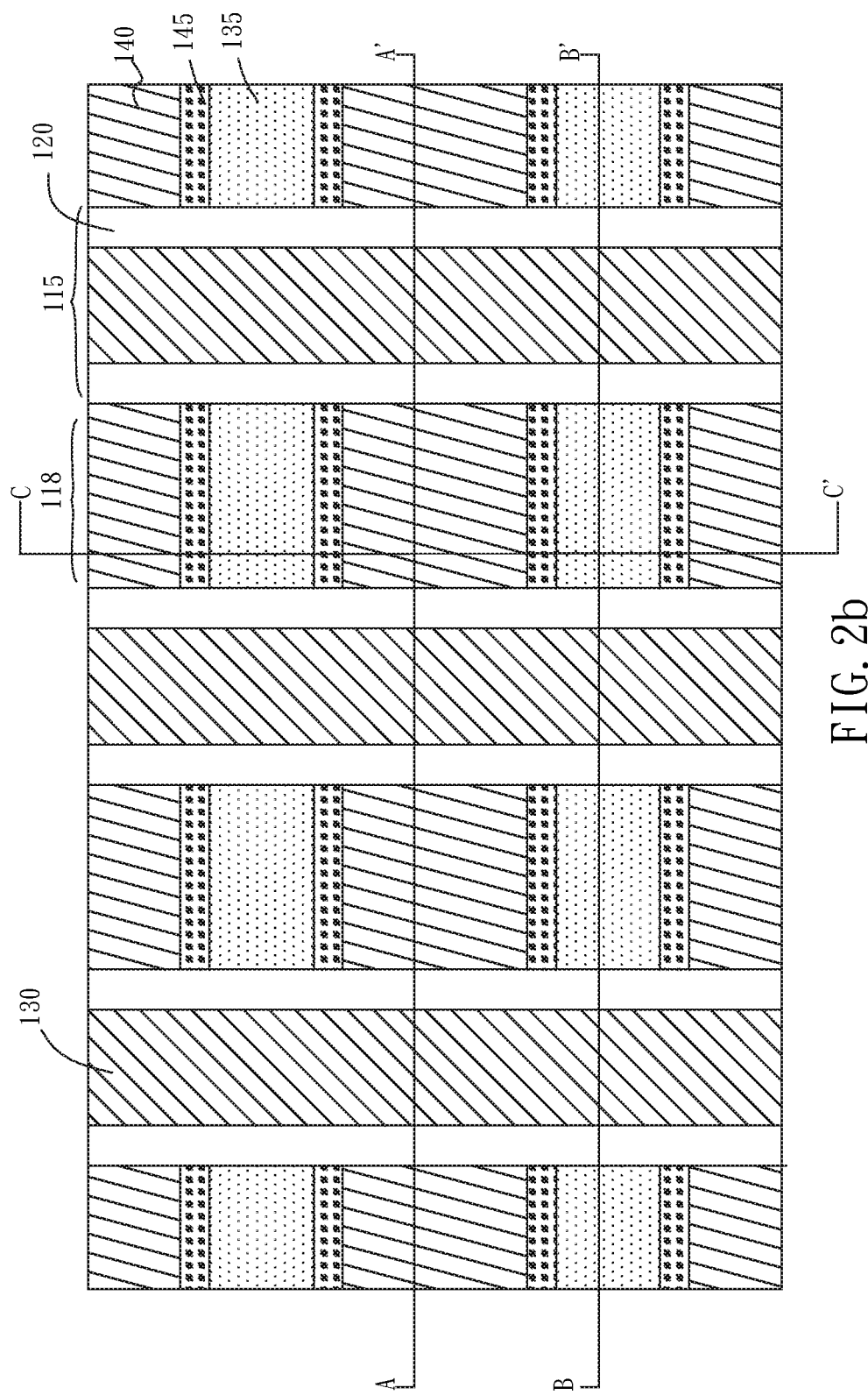
FIG. 2b is a top view illustrating the modified design of the trench MOS rectifier (the top metal layer is not shown) in accordance with the first preferred embodiment of the present invention.
Figure 2C:
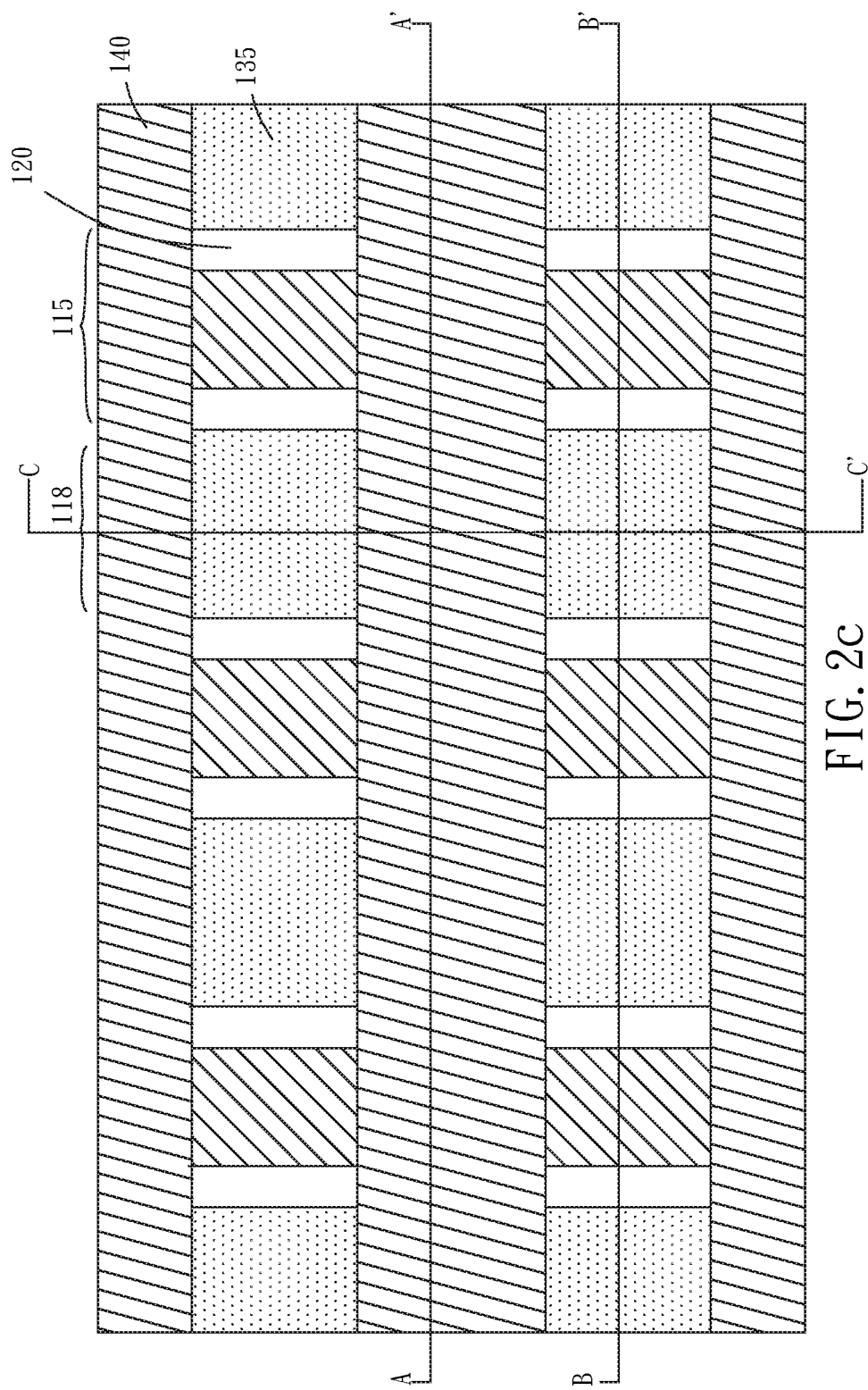
FIG. 2c is a top view illustrating a trench MOS rectifier (the top metal layer is not shown) in accordance with a second preferred embodiment of the present invention.
Figure 13A:
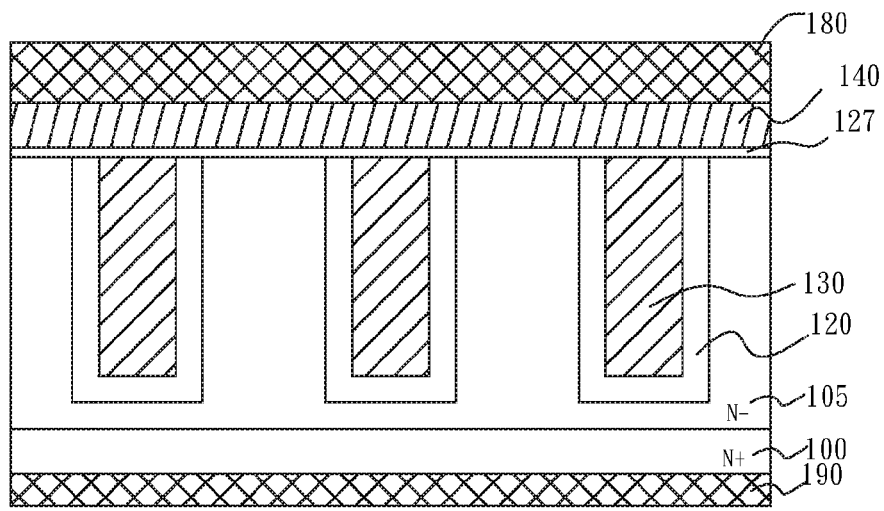
FIG. 13A, FIG. 13B and FIG. 13C are the cross-sectional views respectively, along the A-A' line, the B-B' line and the C-C' line shown in FIG. 2c illustrating the final structure of a trench MOS rectifier in accordance with the second preferred embodiment of the present invention.
Figure 13B:
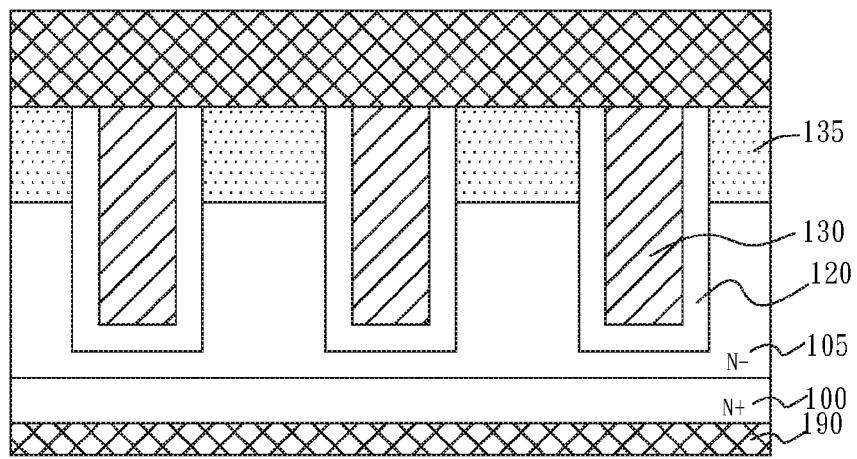
Figure 13C:
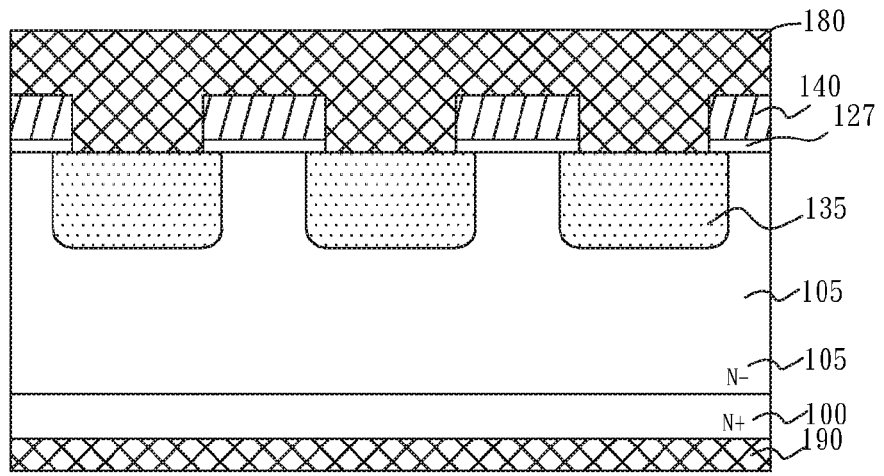

In accordance with a second preferred embodiment of the present invention, a trench rectifier device is illustrated in the plan-view FIG. 2c and cross-sectional views, FIG. 13A, FIG. 13B and FIG. 13C. The figures shows a n– epi-layer 105 on a n+ semiconductor substrate 100 semiconductor substrate 100 having a plurality of trenches 115 in parallel and spaced each other with a mesa 118 formed therein. A trench oxide layer 120 conformally formed on bottoms and sidewalls of the trenches 115. A first poly-Si layer 130 having conductive impurities in-situ doped formed on the trench oxide layer 120 and filled the trenches 115 to form a trench MOS structure. A plurality of row of planar MOS structures formed on and across the mesas 118 and trenches. Each planar MOS structure has a second poly-Si layer 140 formed on the planar gate oxide layer 127, which is formed on the mesa 118 and on the first poly-Si layer 130. Asides the MOS structure are p-type impurity doped regions 135 formed into the mesas as sources regions. A top-metal layer served as anode electrode of the rectifier device is then formed on the planar MOS structures and on the sources regions 135. A bottom metal layer as a cathode is formed on the backside of the n+ semiconductor substrate 100.

The differences between two preferred embodiments are at the morphology of the planar MOS structure. In the first preferred embodiment, the MOS structures are formed on the mesas 118 only but in the second preferred embodiment, the MOS structures are in a form of rows formed across the mesas 118 and first poly-Si layer 130.

In an alternative embodiment of the second preferred embodiment, each p-type impurity implanted region 135 further comprises two separate n+ impurity implanted regions 145. The n+ impurity implanted region 145 adjacent the MOS structure. Please refer to plan-view FIG. 2d and cross-sectional views FIG. 14A, FIG. 14B and FIG. 14C.

Figure 2D:
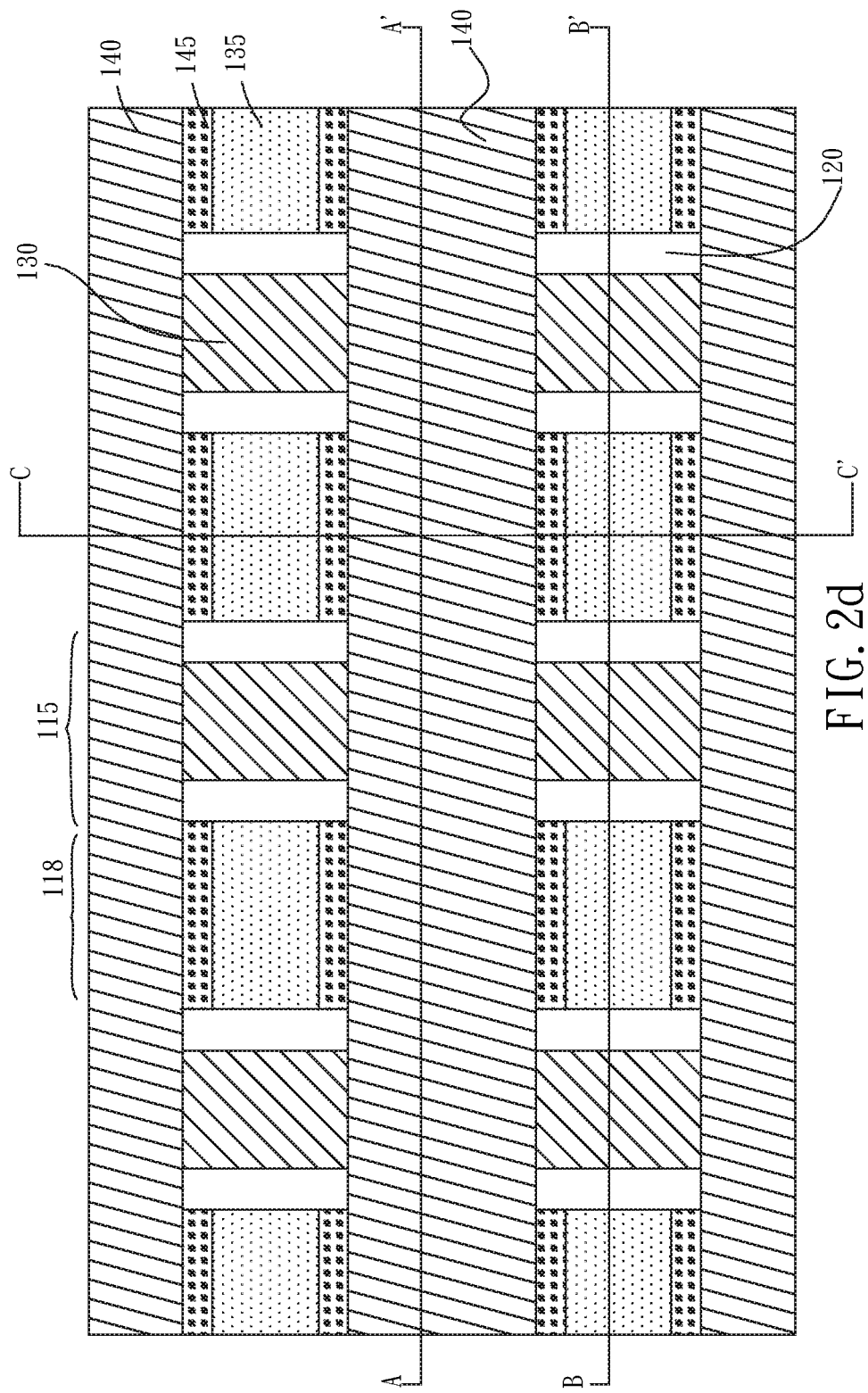
FIG. 2d is a top view illustrating the modified design of the trench MOS rectifier (the top metal layer is not shown) in accordance with the second preferred embodiment of the present invention.
Figure 2E:
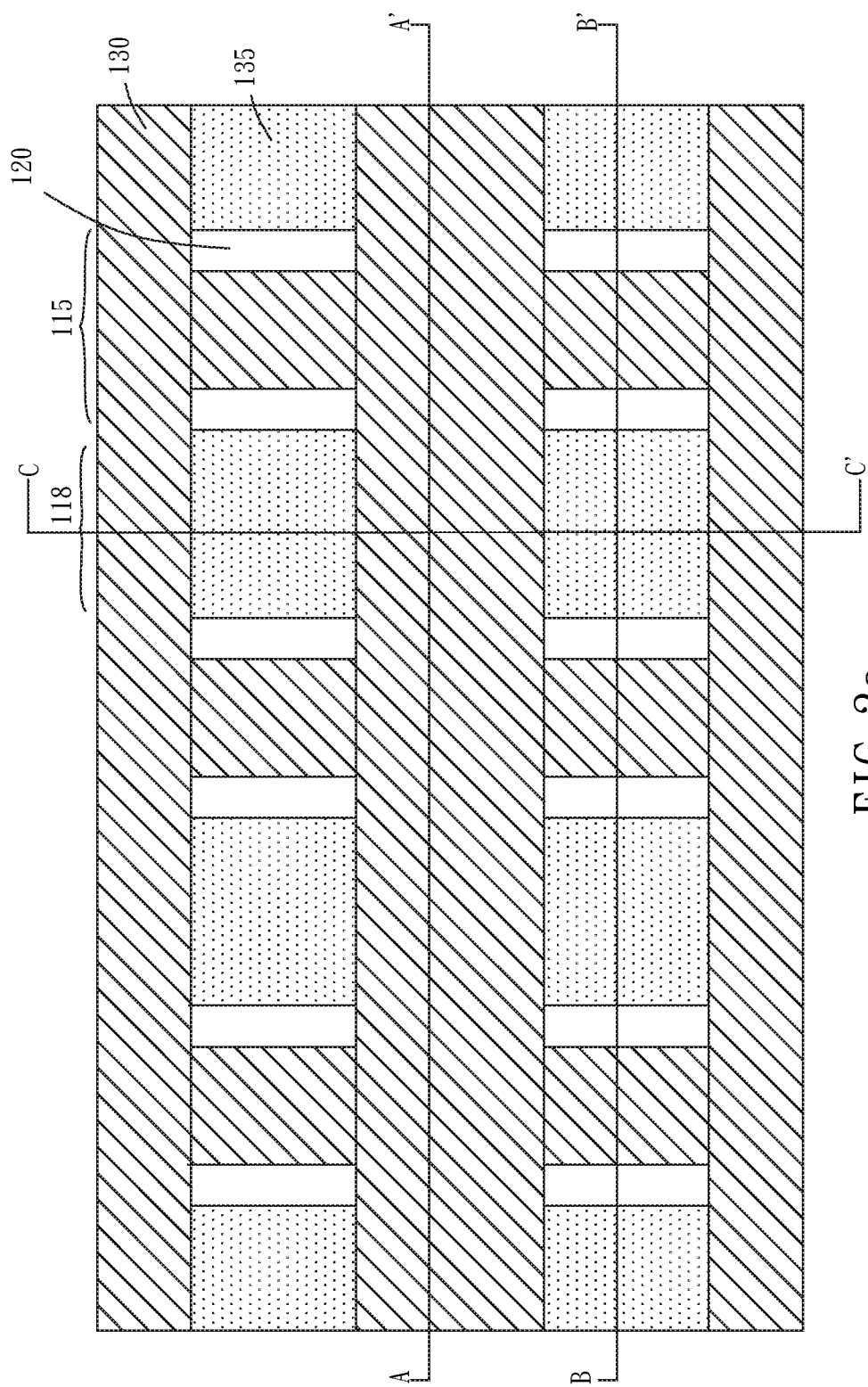
FIG. 2e is a top view illustrating a trench MOS rectifier (the top metal layer is not shown) in accordance with a third preferred embodiment of the present invention.
Figure 18A:
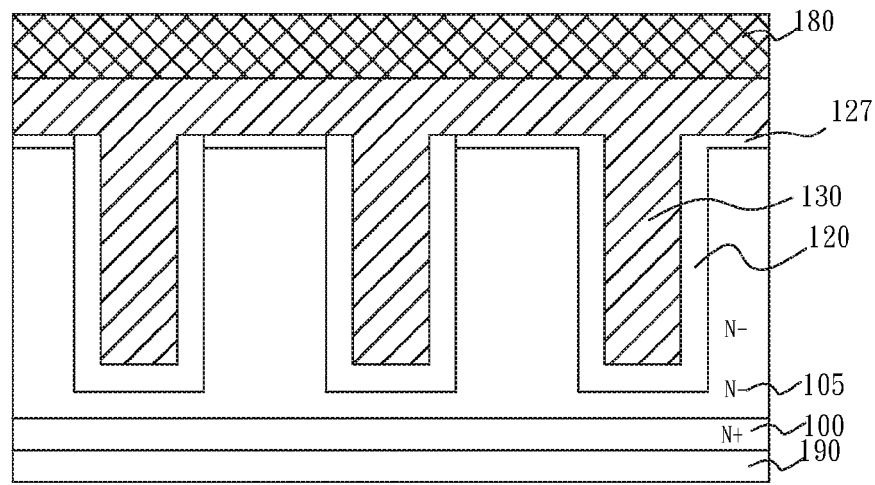
FIG. 18A, FIG. 18B and FIG. 18C are the cross-sectional views respectively, along the A-A' line, the B-B' line and the C-C' line shown in FIG. 2e illustrating the final structure of a trench MOS rectifier in accordance with the third preferred embodiment of the present invention.
Figure 18B:
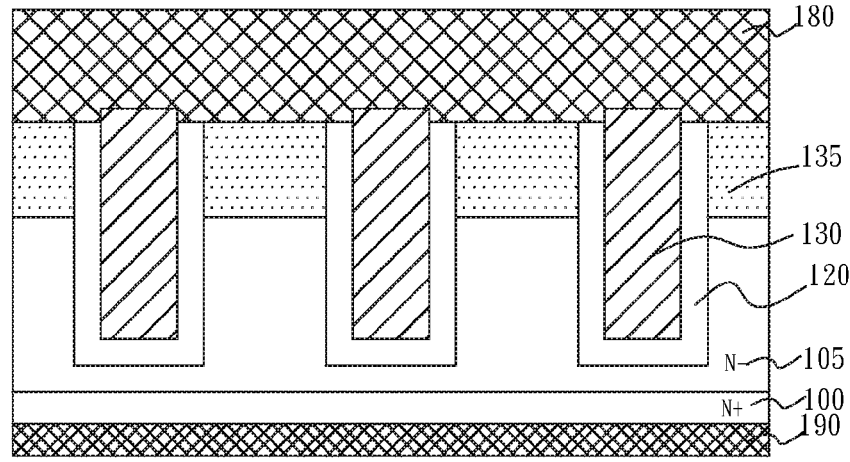
Figure 18C:
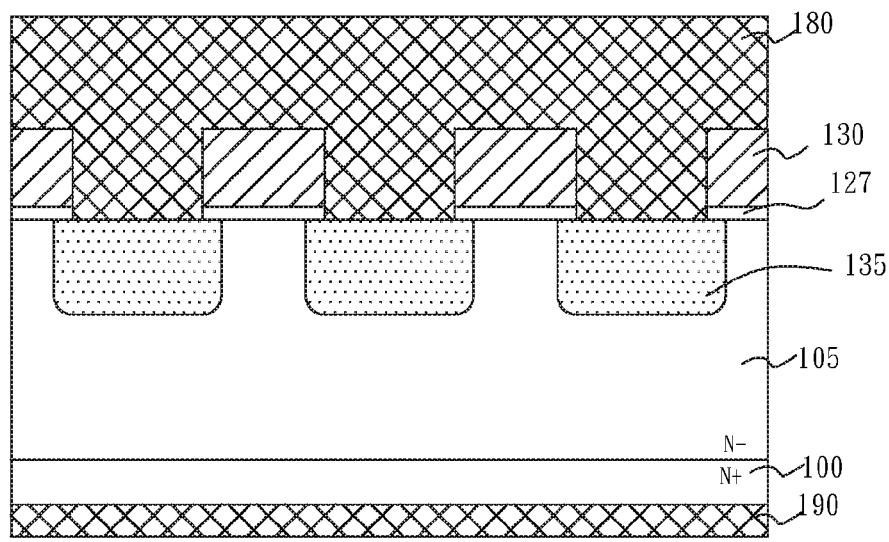

In a third preferred embodiment of the present invention, a trench rectifier device is illustrated in the plan-view FIG. 2e and cross-sectional views, FIG. 18A, FIG. 18B and FIG. 18C. The figures shows a n– epi-layer 105 on a n+ semiconductor substrate 100 having a plurality of trenches 115 in parallel and spaced each other with a mesa 118 formed therein. A trench oxide layer 120 is conformally formed on bottoms and sidewalls of the trenches 115. A planar gate oxide layer 127 is formed on the mesas 118. A first poly-Si layer 130 having conductive impurities in-situ doped is then formed on the trench oxide layer 120 and filled the trenches 115 until over the mesas 118 by a predetermined thickness. A plurality of row of defined first poly-Si layer 130 including planar MOS structures formed on the mesas 118. Asides the MOS structure are p-type impurity doped regions 135 formed into the n– epi-layer 105. A top metal layer is as an anode electrode of the device is then formed on the first poly-Si layer and on the sources regions 135. A bottom metal layer 190 served as a cathode is formed on the backside of n+ semiconductor substrate 100.

In an alternative embodiment of the third preferred embodiment, each p-type impurity implanted region 135 further comprises two separate n+ impurity implanted regions 145. The n+ impurity implanted region 145 adjacent the MOS structure. Please refer to plan-view FIG. 2e and cross-sectional views FIG. 19A, FIG. 19B and FIG. 19C.

The detailed processes for forming trench rectifier are as follows.

Figure 3:
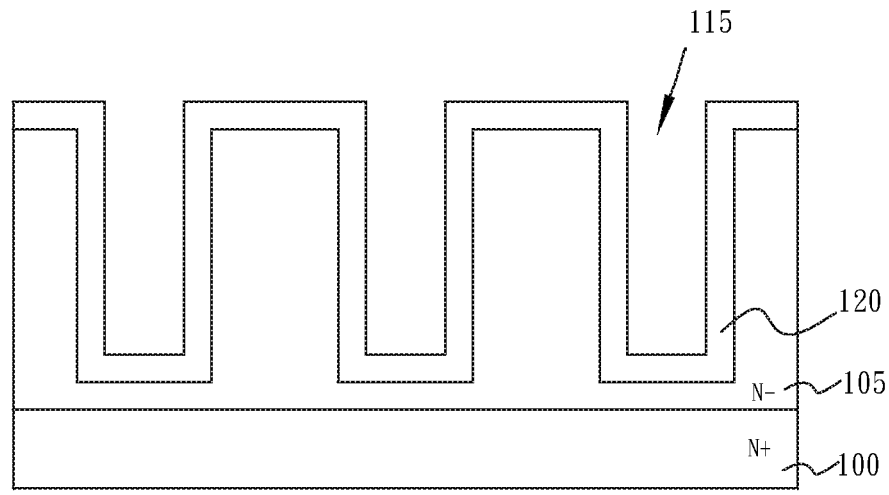
FIG. 3 is a cross-sectional view illustrating a plurality of trenches formed in the n− epitaxial layer and a trench oxide layer successively formed thereon in accordance with the first preferred embodiment of the present invention.

Please refer to FIG. 3. The cross-sectional view depicts an n– epi-layer 105 on a n+ semiconductor substrate 100 having a plurality of trenches 115 in parallel and spaced each other with a mesa 118 formed therein. The trenches 115 may be formed by a dry etch using a photoresist pattern layer or a hard mask layer with a patterned nitride layer/pad oxide as an etching mask (not shown).

Subsequently, a thermal oxidation process is carried out to form a trench oxide layer 120 conformally formed on the sidewalls and bottoms of the trenches and the mesas 118. The processes can repair the damage during etching.

Figure 4:
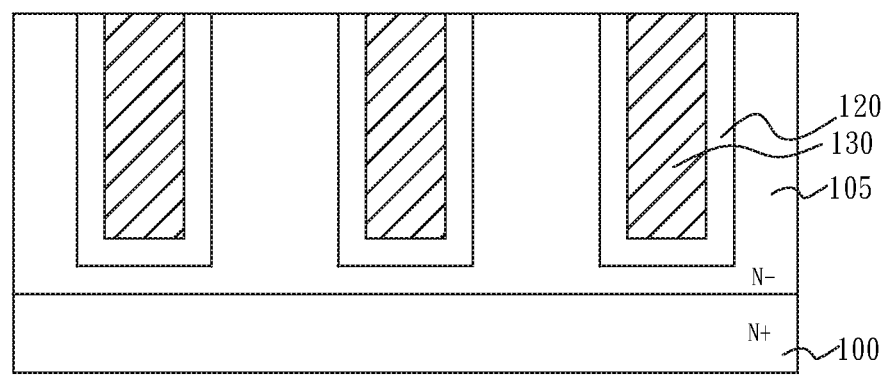
FIG. 4 is a cross-sectional view illustrating a first poly-Si layer refilled the trenches and then an etch back performed to remove the first poly-Si layer and the trench oxide layer over the mesas in accordance with the first preferred embodiment of the present invention.

Referring to FIG. 4 a first poly-Si layer 130 with in-situ doped conductive impurities is deposited within the trenches 115 until overfilled. Thereafter, an etching back or a chemical mechanical polishing technology is performed to remove the first poly-Si layer 130 overflowed and the trench oxide layer 120 on the mesa using the surface of the n– epi-layer 105 as an etching stop layer.

Figure 5:
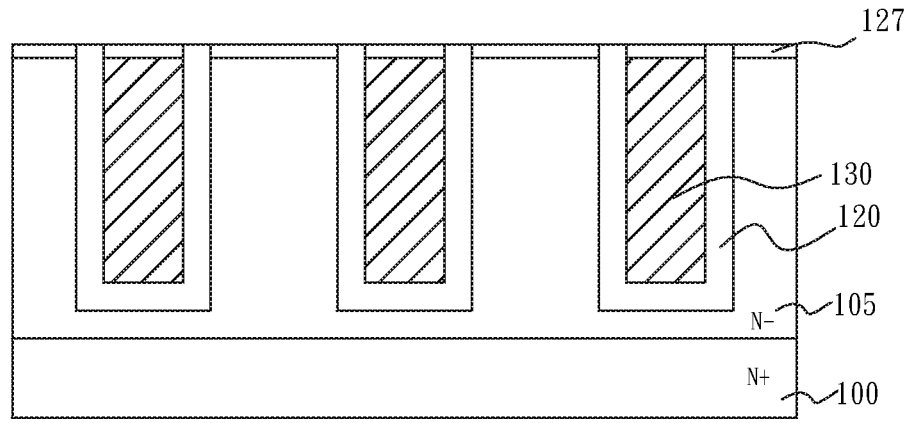
FIG. 5 is a cross-sectional view illustrating a planar oxide layer formed on the mesas; in accordance with the first preferred embodiment of the present invention.

Next, please refer to FIG. 5; a thermal oxidation is carried out to form a planar gate oxide layer 127 on the first poly-Si layer 130 and the mesa 118. The planar gate oxide layer 127 is a thinning oxide layer about 1-50 nm in thickness. The trench oxide layer 120 has about two folds to 100 folds in thickness than the planar gate oxide layer 127.

Thereafter, a second poly-Si is deposited on the planar gate oxide layer 127. A photoresist pattern 142 is formed on the second poly-Si layer 140 to define the positions of the planar MOS gate structure.

Figure 7A:
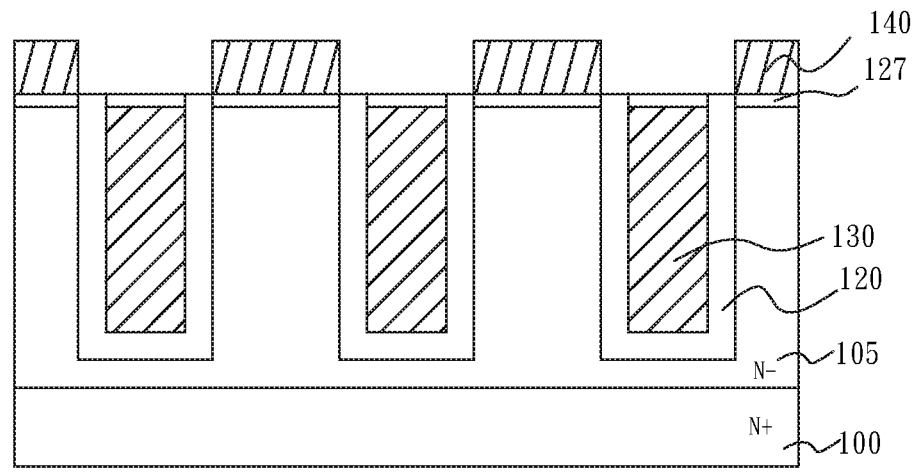
FIG. 7A, FIG. 7B and FIG. 7C are the cross-sectional views respectively, along the A-A' line, the B-B' line and the C-C' line shown in FIG. 2a illustrating the second poly-Si layer patterned and p type impurity implanted regions formed under the mesas in accordance with the first preferred embodiment of the present invention.
Figure 7B:
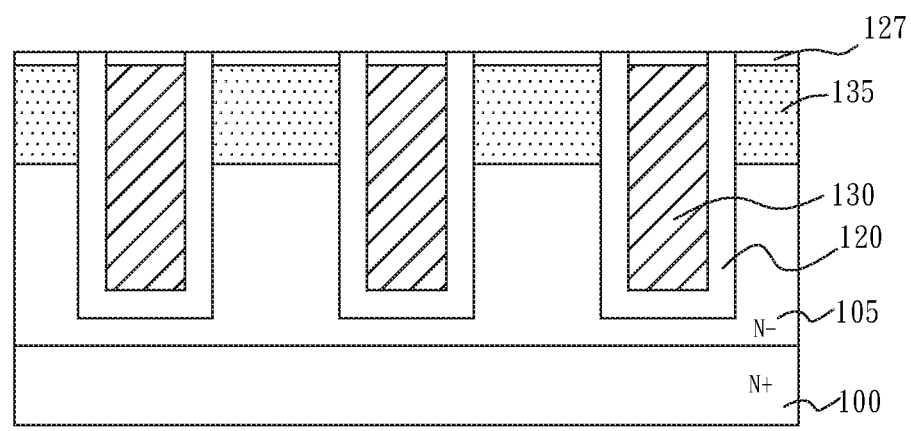

An anisotropic etch is performed to pattern the second poly-Si layer 140 using the photoresist pattern 142 as an etching mask. The cross-sectional view FIG. 7A along the cutting line AA' of the FIG. 2a depicts the planar MOS gate, and the cross-sectional view FIG. 7B along the cutting line BB' of the FIG. 2a depicts source regions asides the trench MOS. In the regions, the second poly-Si layer is removed and a first ion implantation is carried out by implanting p type impurities to form p regions 135. After patterning, the photoresist pattern is stripped off. Hereinafter, unless otherwise note, the ion implantations will be performed by blanketing so that all the exposed areas will be implanted with the impurity ions. However, the regions with the impurity ions in the first poly-Si layer 130 and the second poly-Si layer 140 are skipped without shown in the figures for simplicity.

The doses used for implanting the p implanted region 135 are to make the concentration of the p impurity ions is higher than that of the n– epi-layer 105 by 1-3 order of magnitude. For example, the implant doses are between about 1E12-1E14/cm$^2$ and the implant energy is between about 10 keV-1000 keV.

Figure 7C:
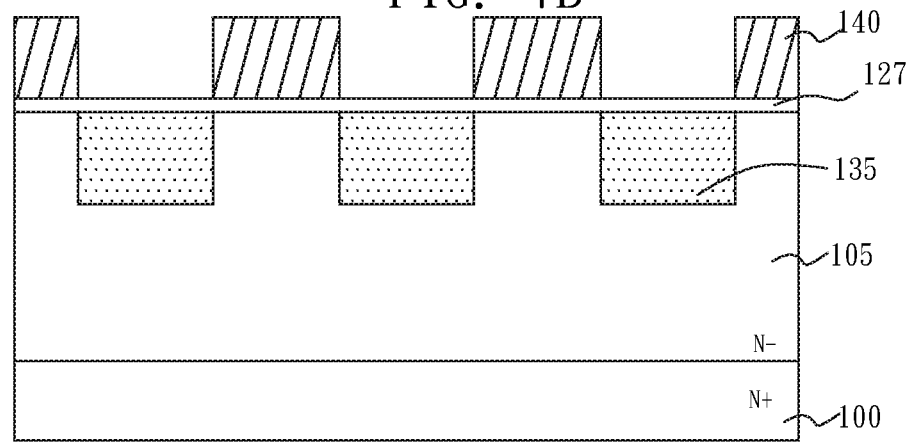

The cross-sectional view FIG. 7C along the cutting line CC' of the FIG. 2a, shows the planar MOS gate and the p implant region 135. The cutting line CC' is along the longitudinal direction of the trenches 115. An anneal process is then carried out to activate the implanted ions.

Thereafter, a dilute HF or NH$_4$F buffer solution is used to remove the exposed planar gate oxide layer 127. Finally, a top-metal layer 180 is deposited on the exposed area to connect the planar gate and the source region 135. Alternatively, before forming the top metal layer 180, a self-aligned silicide process is performed. The silicide process includes sequentially sputtering Ti and TiN on the exposed area and then performing rapid thermal anneal (RTA) process to make the metal layer reactive with the second poly-Si layer 140 and the n– epi-layer 105 to form metal silicide (not shown). The un-reactive metal layers are then removed by wet etching. The top metal layer 180 may be one layer or two or three stack layers such as TiNi/Ag, TiW/Al or Al etc. FIG. 8A-FIG. 8C shows cross-sectional views of the structure.

Figure 9A:
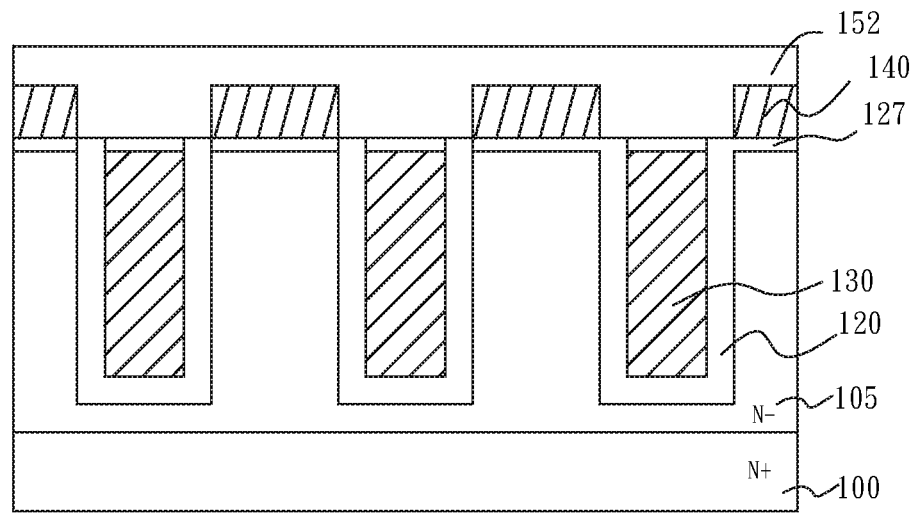
FIG. 9A, FIG. 9B and FIG. 9C are the cross-sectional views respectively, along the A-A' line, the B-B' line and the C-C' line shown in FIG. 2b illustrating n+ impurities implanted region formed in the p regions using a photoresist pattern as a mask in accordance with a modified structure of the first preferred embodiment of the present invention.
Figure 9B:
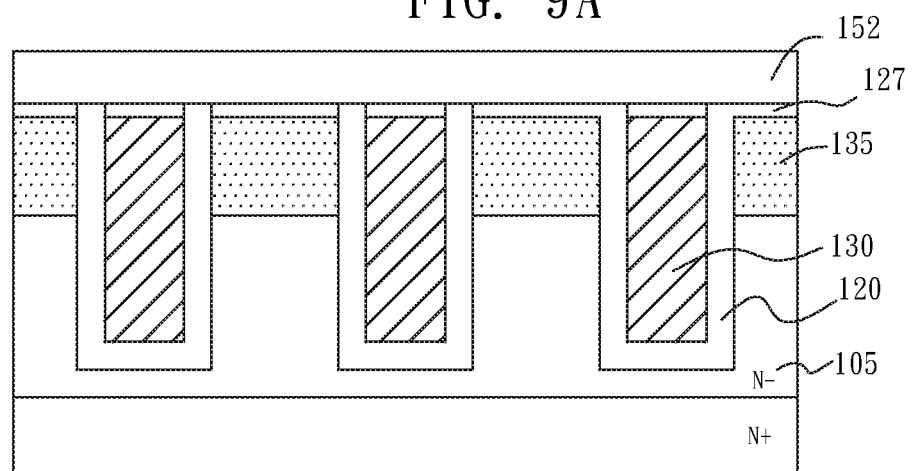
Figure 9C:
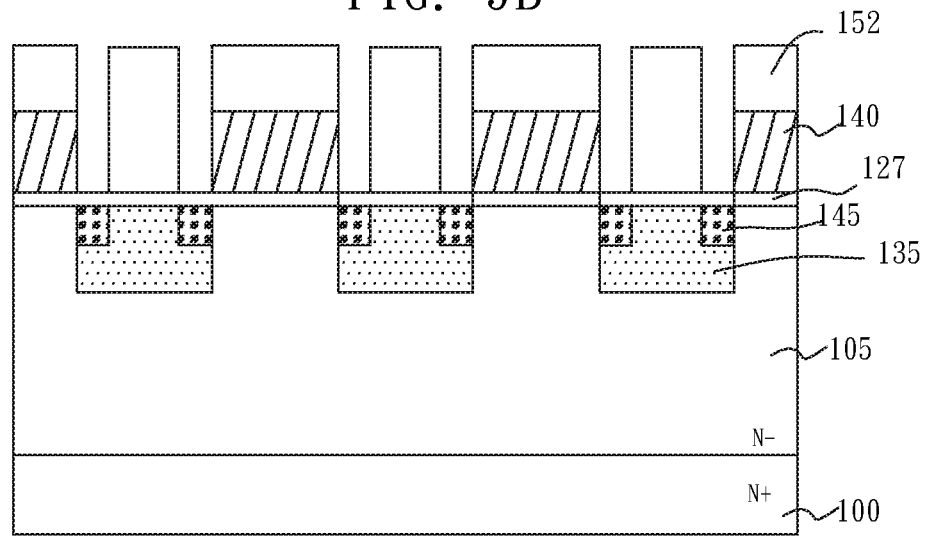
Figure 10A:
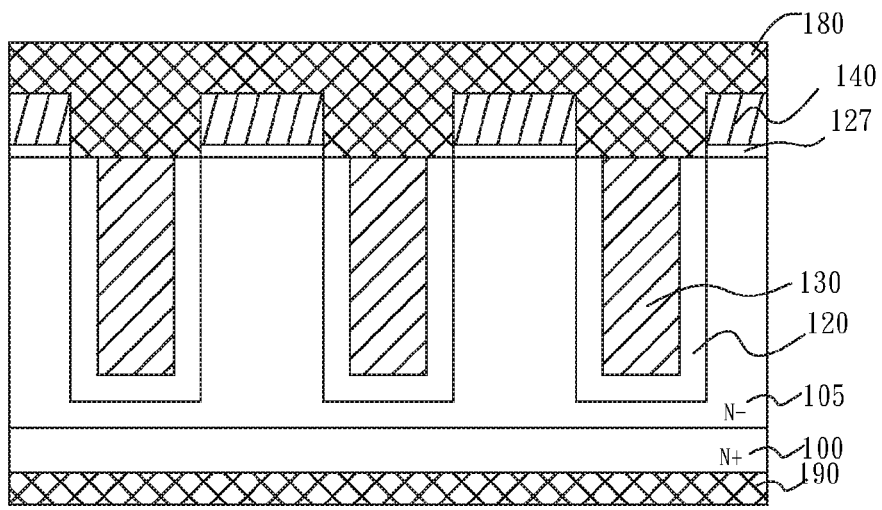
FIG. 10A, FIG. 10B and FIG. 10C are the cross-sectional views respectively, along the A-A' line, the B-B' line and the C-C' line shown in FIG. 2b illustrating the modified structure of a trench MOS rectifier in accordance with the first preferred embodiment of the present invention.
Figure 10B:
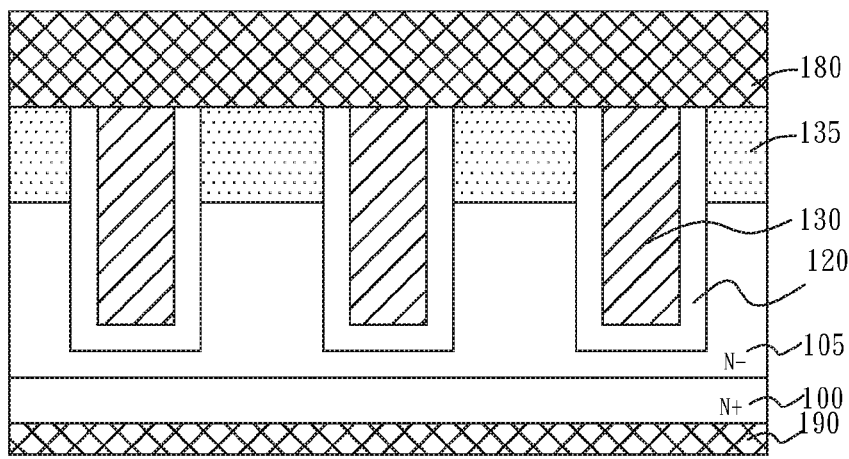
Figure 10C:
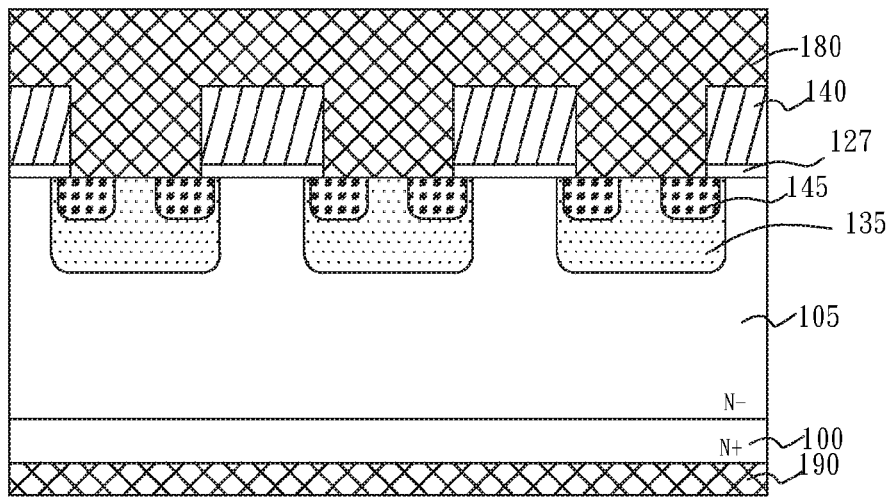

The modified embodiment of the first preferred embodiment is to form two separated n+ regions 145 in the p implanted region 135, as shown in FIGS. 9A-9C. FIGS. 10A~10C show cross-sectional views of the final structure of the trench MOS rectifier. FIG. 2b is the top-view without the top-metal layer 180. The doses for n+ regions 145 implantation are between about 1E13-1E15/cm$^2$.

Figure 6:
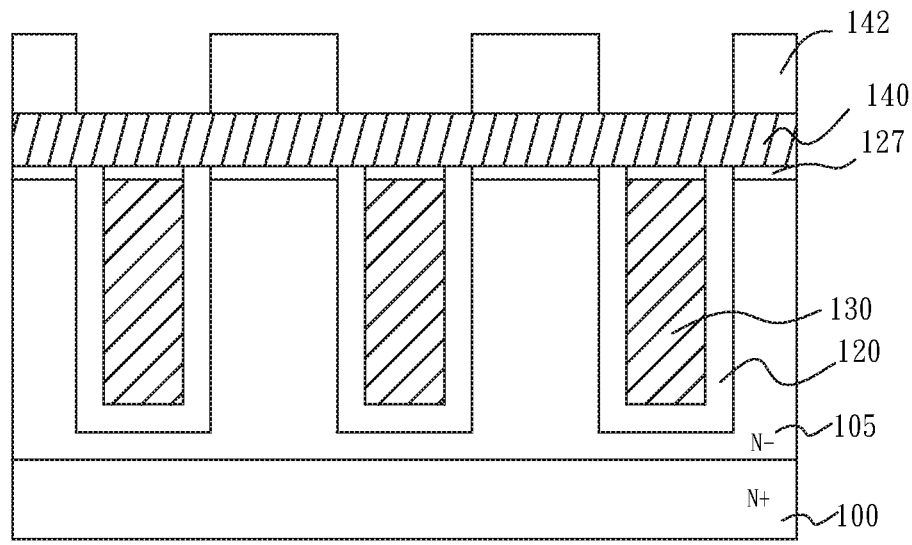
FIG. 6 is a cross-sectional view illustrating a second poly-Si layer formed and then a photoresist patterned formed on the second poly-Si layer in accordance with the first preferred embodiment of the present invention.

In accordance the second preferred embodiment, the processes before forming the photoresist layer on the second poly-Si layer 140 shown in FIGS. 6A-6C are the same as the first preferred embodiment.

Figure 11A:
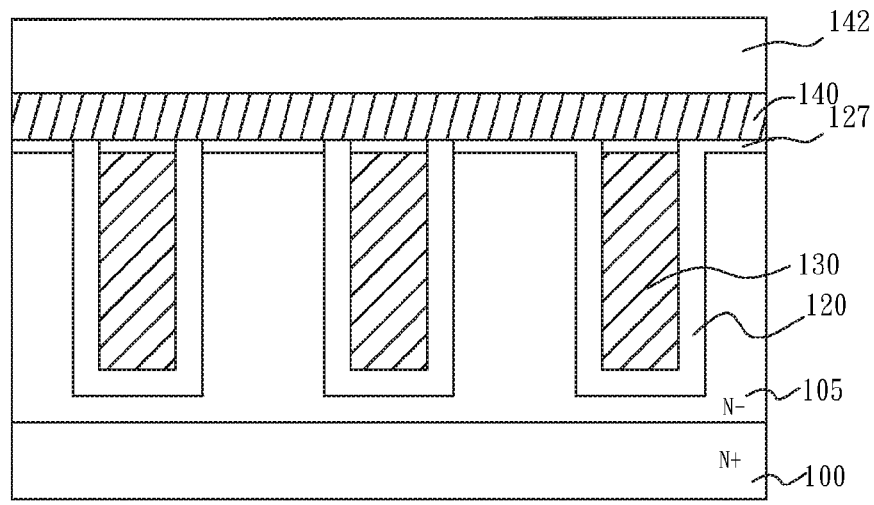
FIG. 11A, FIG. 11B and FIG. 11C are the cross-sectional views respectively, along the A-A' line, the B-B' line and the C-C' line shown in FIG. 2c illustrating the second poly-Si layer patterned and p type impurity implanted regions formed under the mesas in accordance with the second preferred embodiment of the present invention.
Figure 11B:
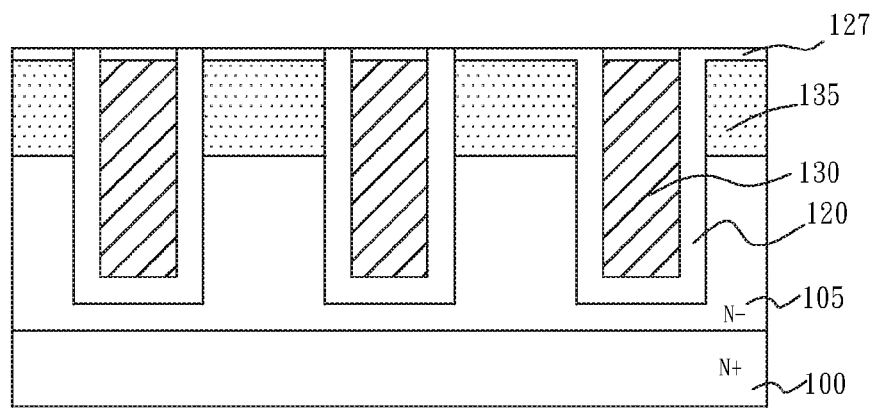
Figure 11C:
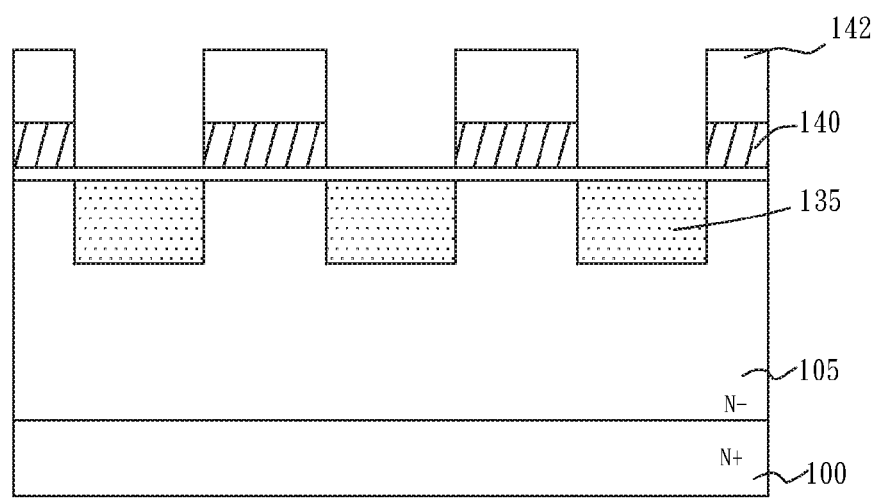
Figure 12A:
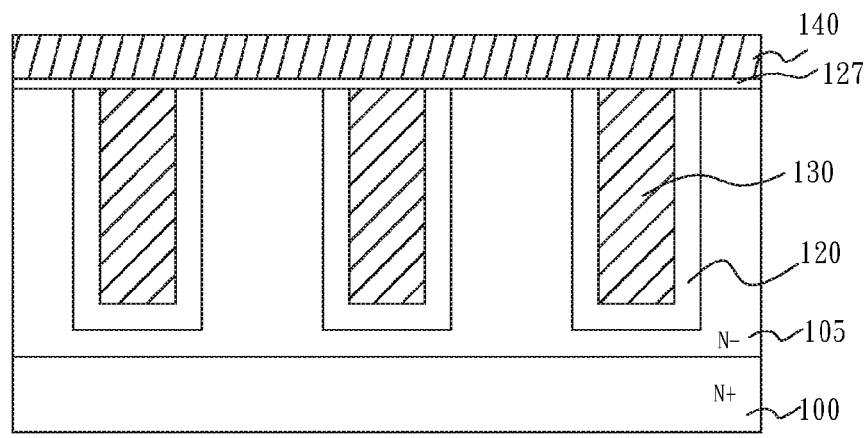
FIG. 12A, FIG. 12B and FIG. 12C are the cross-sectional views respectively, along the A-A' line, the B-B' line and the C-C' line shown in FIG. 2c illustrating the exposed planar gate oxide layer removed in accordance with the second preferred embodiment of the present invention.
Figure 12B:
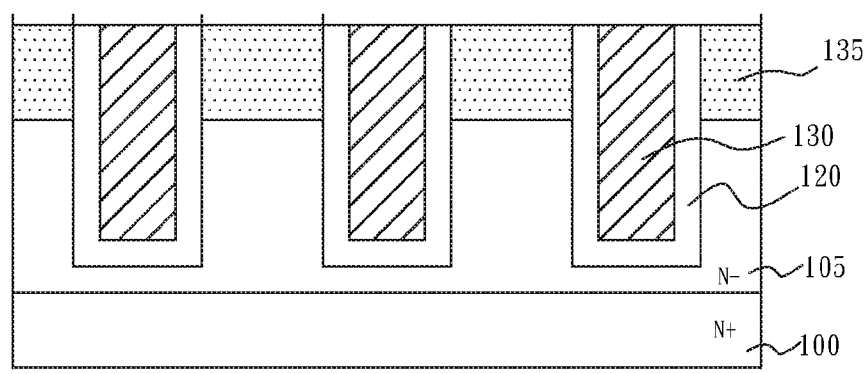
Figure 12C:
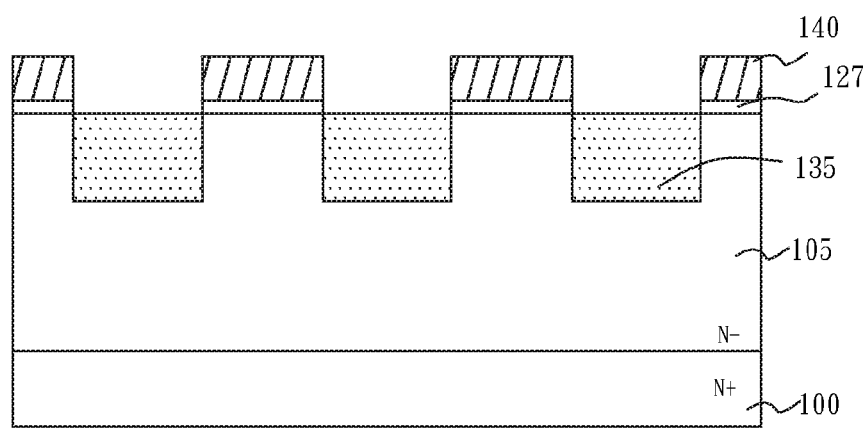

Please refer to FIGS. 11A-11C. A photoresist pattern layer 142 for planar MOS structure definition is formed on the second poly-Si layer 140. The photoresist pattern layer 142 masked the second-poly Si layer 140 is to define a plurality of rows of MOS gates along the AA' cutting line of FIG. 2c. The photoresist pattern layer 142 exposed the second-poly SI 140 is to define the implanted regions along the BB' cutting line of FIG. 2c. An anisotropic etching is then carried out to pattern the second poly-Si layer 140 using the photoresist pattern layer 142 as etching mask. After that a first ion implantation is performed to implant p-type conductive ions to form the p-region 135. The doses and the energy for the first implantation are the same as that of the first preferred embodiment.

After stripped off the photoresist layer 142, an anneal process is then carried out to activate the implanted ions. A dilute HF or NH$_4$F buffer solution is then used to remove the exposed planar gate oxide layer 127.

Finally, a top-metal layer 180 is deposited on the exposed area to connect the planar gate and the source region. Alternatively, before forming the top metal layer 180, a self-aligned silicide process is performed.

The top metal layer 180 may be one layer or two or three layers such as TiNi/Ag, TiW/Al or Al etc. FIG. 13A-FIG. 13C shows cross-sectional views of the structure. FIG. 2c shows the top view of the trench MOS rectifier in accordance with the second preferred embodiment.

Figure 14A:
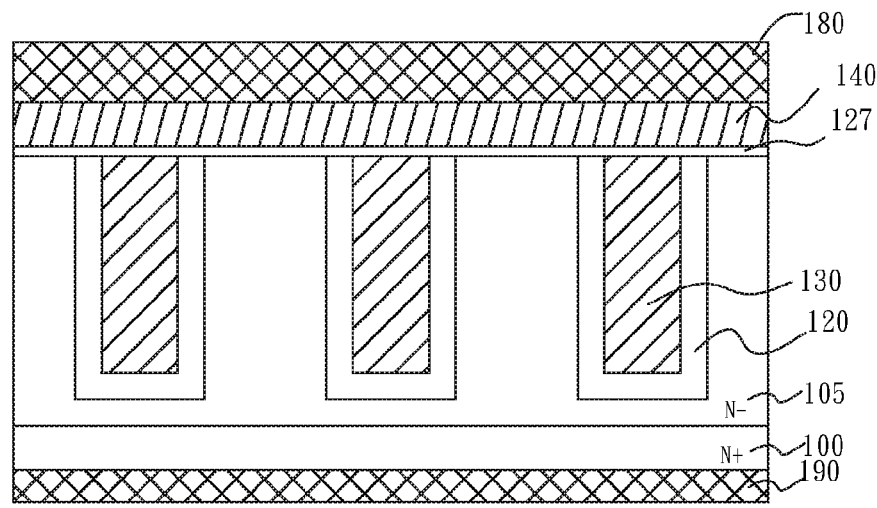
FIG. 14A, FIG. 14B and FIG. 14C are the cross-sectional views respectively, along the A-A' line, the B-B' line and the C-C' line shown in FIG. 2d illustrating the modified structure of a trench MOS rectifier in accordance with the second preferred embodiment of the present invention.
Figure 14B:
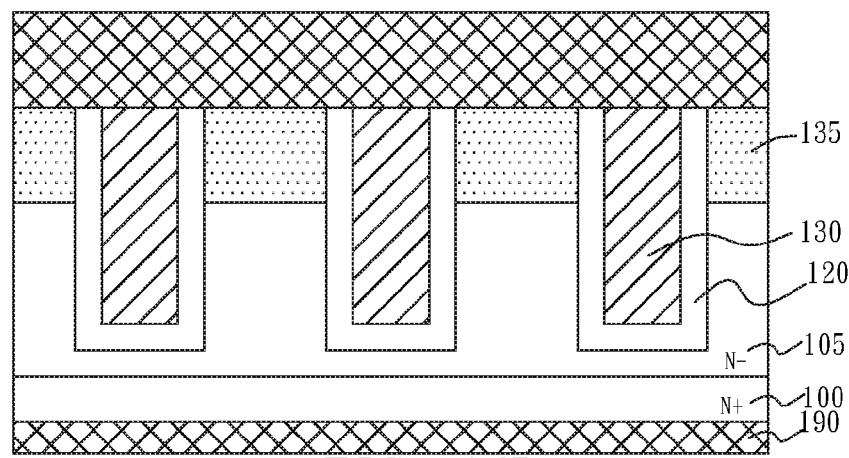
Figure 14C:
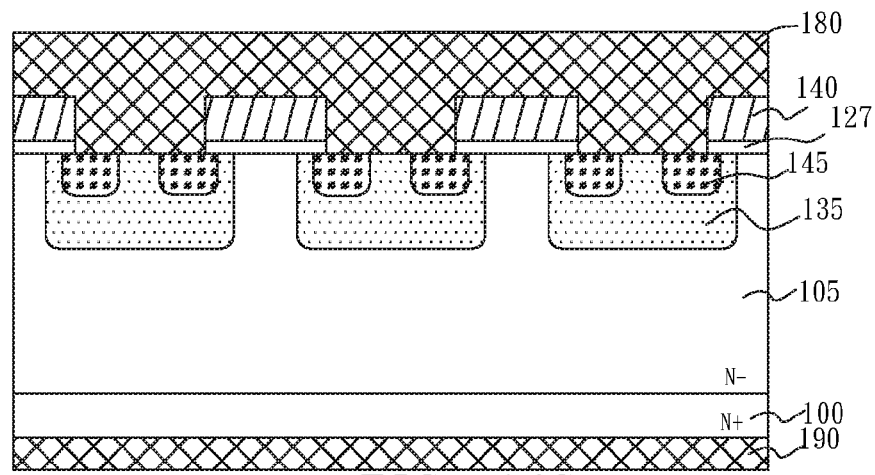
Figure 15:
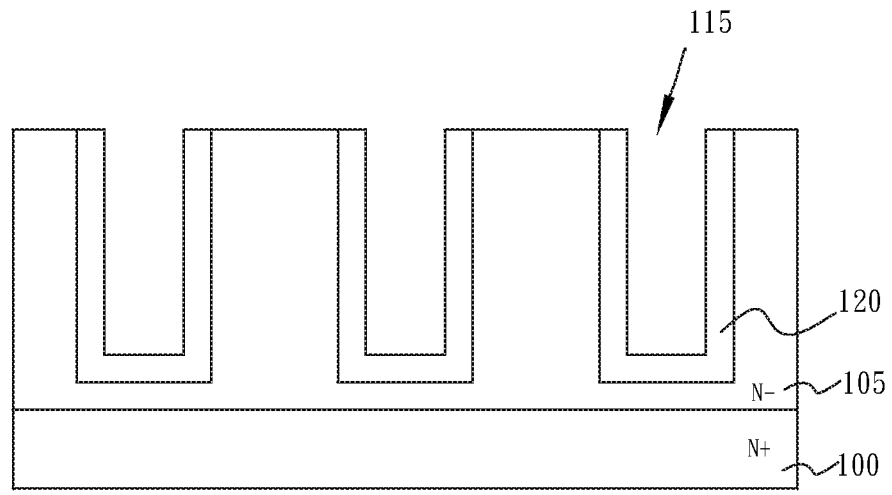
FIG. 15 is a cross-sectional view illustrating a plurality of trenches formed in the n− epitaxial layer and a trench oxide layer successively formed thereon and then a CMP (chemical mechanical polishing) performed to remove the trench oxide layer over the mesa in accordance with the third preferred embodiment of the present invention.

The modified embodiment of the second preferred embodiment is to form two separated n+ regions 145 in the p implanted region 135, using the implantation mask shown in FIGS. 9A-9C. FIGS. 14A~14C show cross-sectional views of the final structure of the trench MOS rectifier. FIG. 2b is the top-view without the top-metal layer 180. FIG. 2d shows the top view of the trench MOS rectifier in accordance with the modified second preferred embodiment . . . .

The aforementioned first and second preferred embodiments, the poly-Si layers include the first poly-Si layer 130 and the second poly-Si layer 140. According to a third preferred embodiment, only the first poly-Si layer 130 is deposited.

Figure 16:
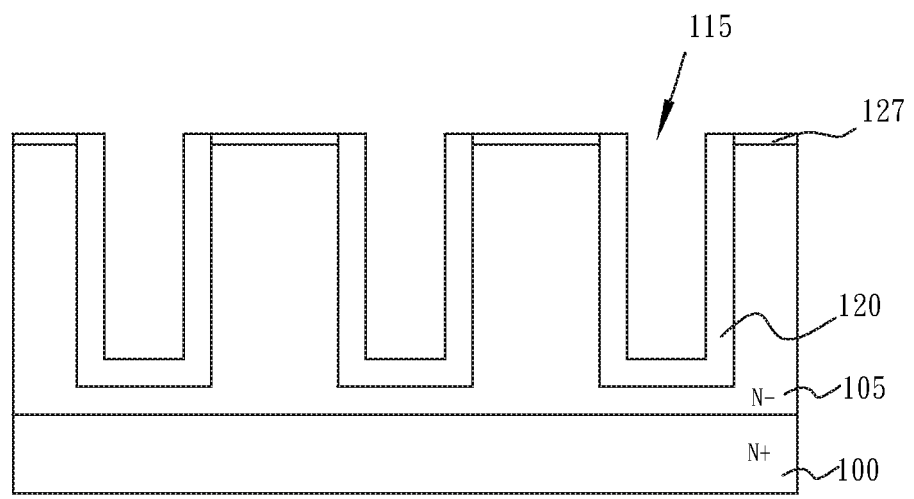
FIG. 16 is a cross-sectional view illustrating a planar gate oxide layer formed on the mesa in accordance with the third preferred embodiment of the present invention.

Turning back to FIG. 3, the trench oxide layer 120 is formed on the sidewalls and bottom of the trenches 115 and the mesas 118. Next, a CMP method is carried out to remove the trench oxide layer 120. A planar gate oxide layer 127 is formed by thermal oxidation. The planar gate oxide layer 127 is much thinner than the original trench oxide layer 120, as shown in FIG. 16.

Figure 17A:
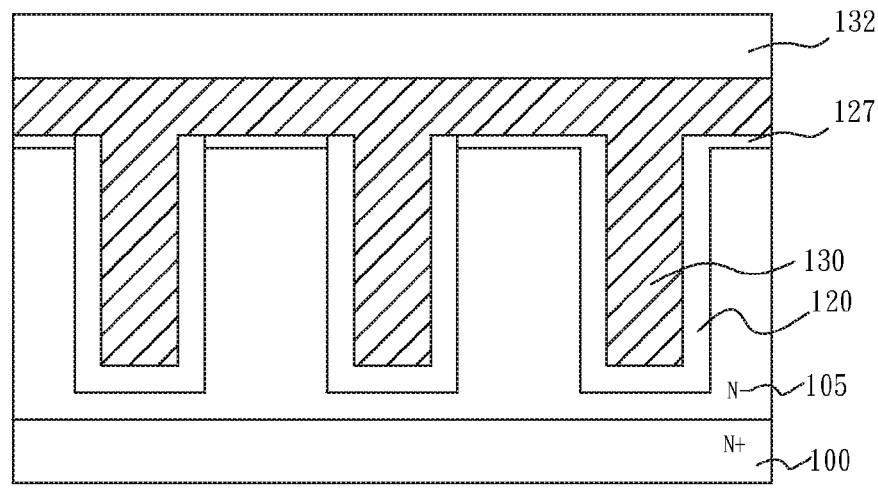
FIG. 17A, FIG. 17B and FIG. 17C are the cross-sectional views respectively, along the A-A' line, the B-B' line and the C-C' line shown in FIG. 2e illustrating the first poly-Si layer patterned and p type impurity implanted regions formed under the mesas in accordance with the third preferred embodiment of the present invention.
Figure 17B:
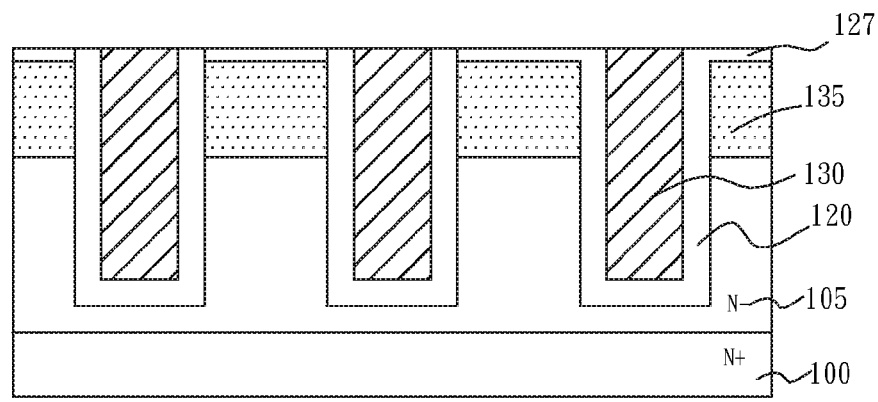
Figure 17C:
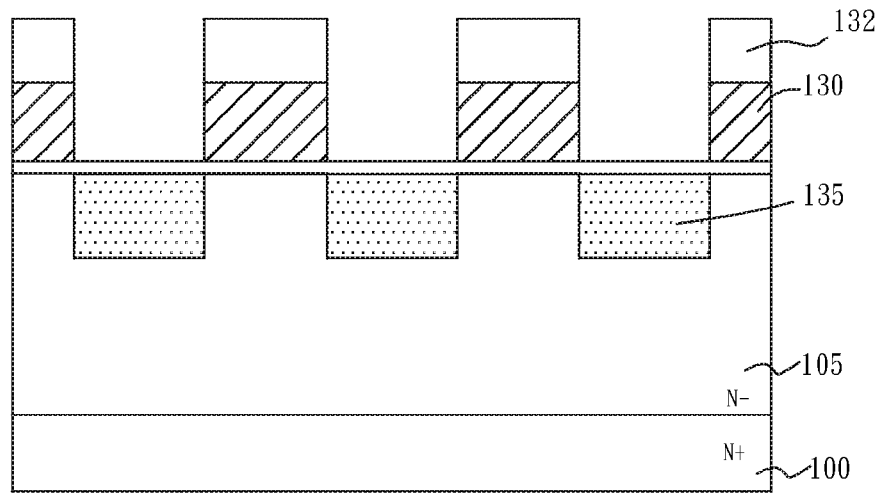

Thereafter, a first poly-Si layer 130 with in-situ doped conductive impurities is deposited to fill the trenches 115 and over the mesa 118 by a predetermined thickness. A photoresist pattern layer 132 is deposited on the first poly-SI layer 130 to define a plurality of MOS gates. An anisotropic etching is then performed using the photoresist pattern layer 132 as etch mask. Please refer to FIG. 17A to FIG. 17C. The photoresist pattern layer 132 masked a plurality of rows of MOS gates, which is along the AA' cutting line of FIG. 2e. Nevertheless, the regions along the BB' cutting line of FIG. 2e is exposed. A first ion implantation to with p-type conductive impurities is then implanted into the exposed region to form p regions 135. The doses and energy of the first ion implantation are between about 1E12-1E14/cm$^2$ and between about 10 keV-1000 keV, respectively.

The photoresist pattern layer 132 is then removed. After that an anneal process is then performed to activate the ions. Thereafter, a dilute HF or NH$_4$F buffer solution is used to remove the exposed planar gate oxide layer 127. Finally, a top-metal layer 180 is deposited on the exposed area to connect the planar gate and the source region 135. Alternatively, before forming the top metal layer 180, a self-aligned silicide process is performed. The top metal layer 180 may be one layer or two or three stack layers such as TiNi/Ag, TiW/Al or Al etc. FIG. 18A-FIG. 18C shows cross-sectional views of the structure.

Figure 2F:
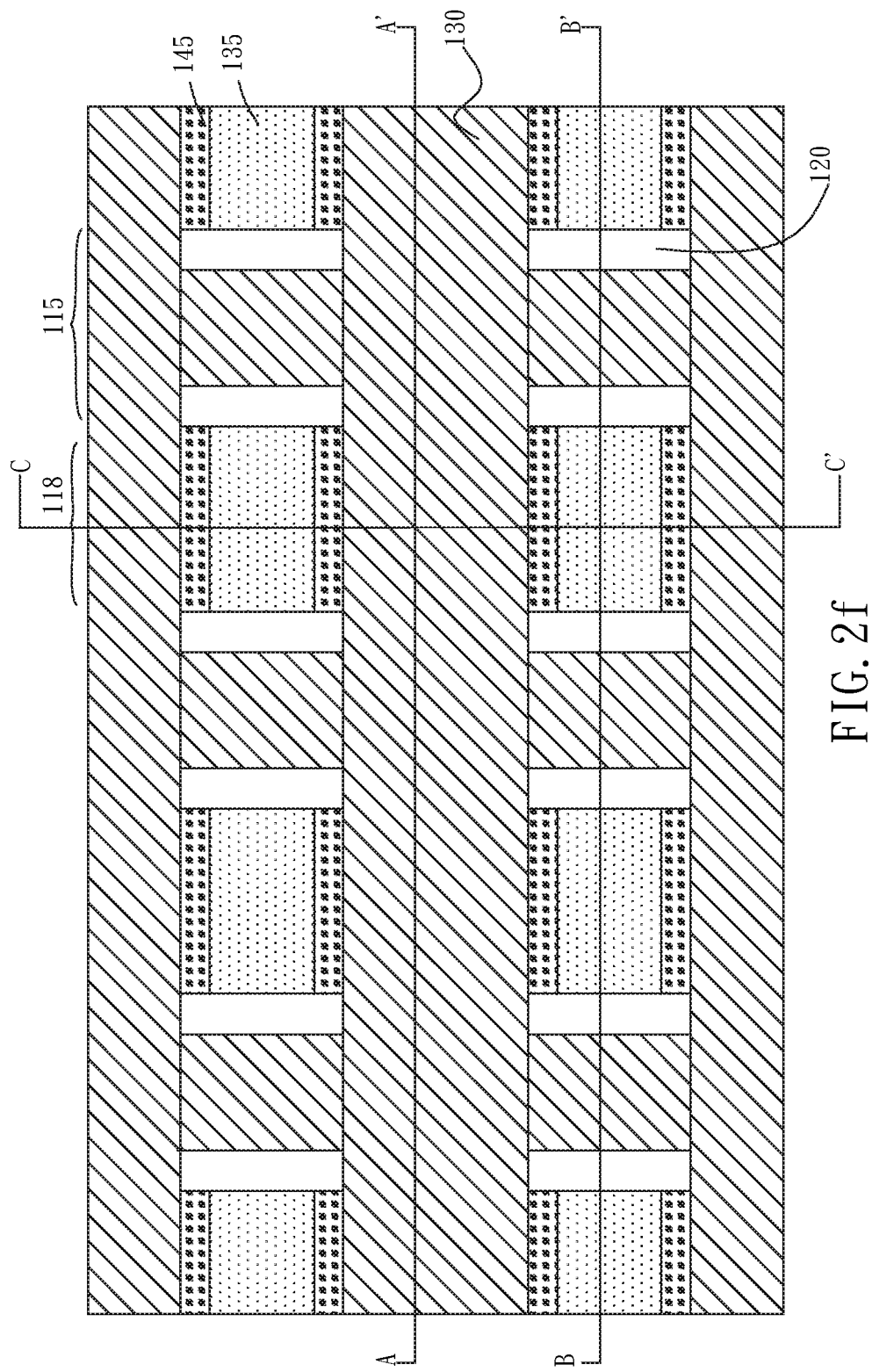
FIG. 2f is a top view illustrating the modified design of the trench MOS rectifier (the top metal layer is not shown) in accordance with the third preferred embodiment of the present invention.
Figure 19A:
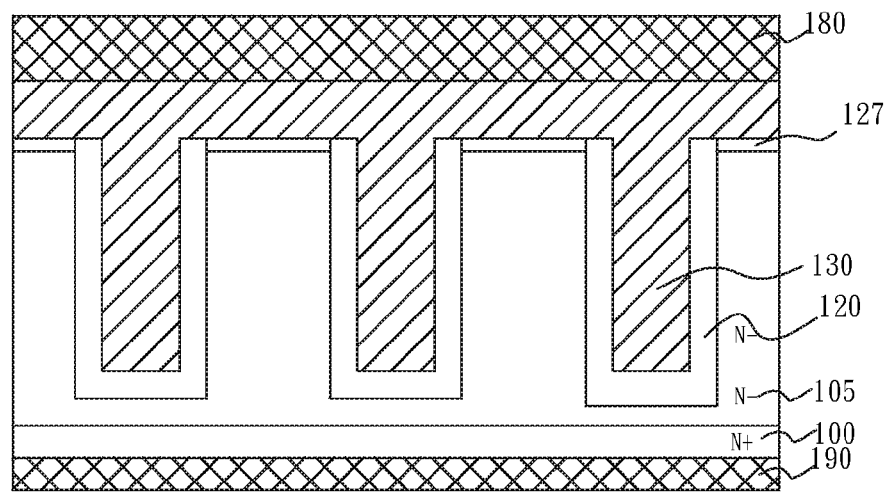
FIG. 19A, FIG. 19B and FIG. 19C are the cross-sectional views respectively, along the A-A' line, the B-B' line and the C-C' line shown in FIG. 2f illustrating the modified structure of a trench MOS rectifier in accordance with the third preferred embodiment of the present invention.
Figure 19B:
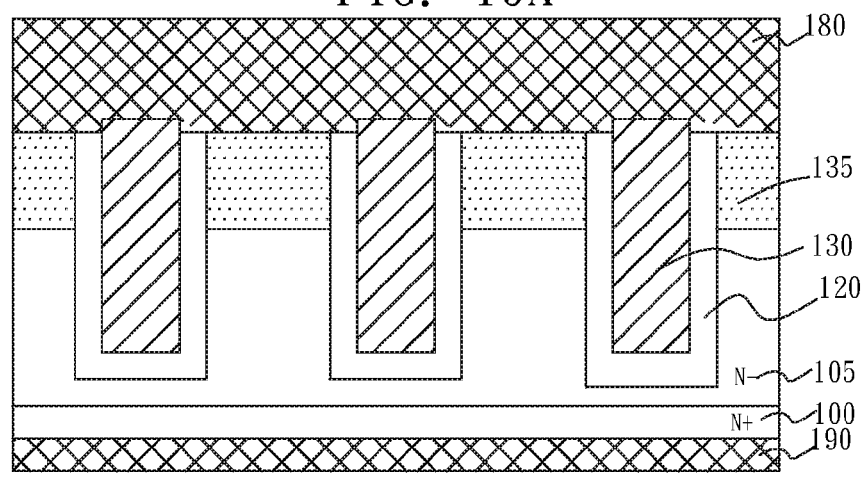
Figure 19C:
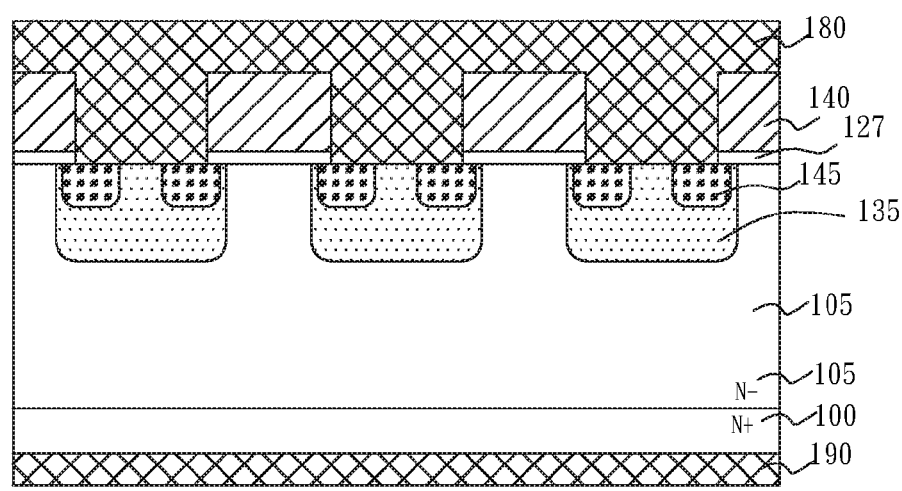

The modified embodiment of the third preferred embodiment is to form two separated n+ regions 145 in the p implanted region 135. FIGS. 19A-190 show cross-sectional views of the final structure of the trench MOS rectifier. FIG. 2f is the top-view without the top-metal layer 180 shows the top view of the trench MOS rectifier in accordance with the modified second preferred embodiment.

The differences among the three preferred embodiments include follows: in the first preferred embodiment, the MOS gates are formed on the mesas only but in the second preferred embodiment, a plurality of rows of the MOS gates are formed across the trenches and mesas. Furthermore, in the first and second preferred embodiments, the poly-Si in the trenches and the poly-Si as MOS gates are formed separately, while in the third preferred embodiment the poly-Si in the trenches and the poly-Si as MOS gates are deposited at the same step. Also in the third preferred embodiment a plurality of rows of the MOS gates are formed across the trenches and mesas, but the poly-Si inside the trenches and MOS gates over it are integrated as a whole part.

The benefits of the present invention are:
(1). In comparison with the conventional planar MOS rectifier, the trench MOS rectifier has better capability to decrease the leakage current while the device is under reverse bias.

(2). The trench MOS rectifier according to the present invention includes also a planar MOS structure which has a thinner planar gate oxide layer than the trench gate oxide so that the device has a lower switch on voltage and least the leakage current.

(3). The p bodies at two sides of a planar MOS gate further comprise an n+ region each furthermore to decrease the forward voltage $V_F$.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A trench rectifier device, comprising:
   an n type lightly doped epitaxial layer on a heavily doped n type semiconductor substrate having a plurality of trenches formed in parallel therein, said trenches spaced each from another by a mesa and said trenches each having a trench oxide layer formed in a bottom and sidewalls thereon;
   a first conductive poly-Si layer filled in said trenches;
   each said mesa having a plurality of MOS gates formed thereon and a plurality of source regions formed therein, in a way that said MOS gates are each interposed along a longitudinal direction of said mesa between said source regions, furthermore, each of said MOS gate having a stack layers of a second conductive poly-Si layer formed on a planar gate oxide layer; and
   a top metal layer formed over said MOS gates and said source regions to connect them together; and
   a rear metal layer as a cathode formed on a rear surface of said heavily doped n type semiconductor substrate.

2. The trench rectifier device according to claim 1, wherein said source regions are p type impurity implanted regions.

3. The trench rectifier device according to claim 1, wherein said source regions each further comprises two n+ regions separated and formed between, respectively, two of said adjacent MOS gates.

* * * * *